United States Patent [19]

Ikeda et al.

[11] Patent Number: 4,714,047
[45] Date of Patent: Dec. 22, 1987

[54] METHOD AND DEVICE FOR FORMING ULTRAFINE PARTICLE FILM OF COMPOUND

[75] Inventors: Hirotane Ikeda, Nishio; Tadashi Hattori, Okazaki; Minoru Ohta, Okazaki; Shinichi Mukainakano, Okazaki, all of Japan

[73] Assignee: Nippon Soken, Inc., Nishio, Japan

[21] Appl. No.: 853,761

[22] Filed: Apr. 18, 1986

[30] Foreign Application Priority Data

Apr. 20, 1985 [JP] Japan .................................. 60-84930

[51] Int. Cl.⁴ ........................ C23C 14/08; C23C 14/26
[52] U.S. Cl. ................................. 118/724; 118/50.1; 118/715; 118/726; 427/255.1
[58] Field of Search ...................... 118/50.1, 715, 724, 118/726, 308; 427/255.1, 255.2, 255.3, 180, 294

[56] References Cited

U.S. PATENT DOCUMENTS

| Re. 26,857 | 4/1970 | Auwarter | 427/294 |
|---|---|---|---|
| 2,539,149 | 1/1951 | Miller | 427/294 |
| 3,695,910 | 10/1972 | Louderback et al. | 427/255.3 |
| 4,217,374 | 8/1980 | Ovshinsky et al. | 427/39 |
| 4,362,767 | 12/1982 | Nouchi et al. | 118/726 |
| 4,395,440 | 7/1983 | Abe et al. | 118/726 |
| 4,486,464 | 12/1984 | Young | 427/63 |

FOREIGN PATENT DOCUMENTS

| 0142841 | 8/1984 | Japan | 118/50 |
|---|---|---|---|
| 0142842 | 8/1984 | Japan | 118/50 |
| 0147637 | 8/1984 | Japan | 118/50 |
| 2119970 | 11/1983 | United Kingdom | 118/50.1 |

OTHER PUBLICATIONS

DaSilva et al., IBM Tech. Disclosure Bull., vol. 4, No. 6, Dec. 1961, pp. 6–7.

Primary Examiner—John E. Kittle
Assistant Examiner—Alain Bashore
Attorney, Agent, or Firm—Cushman, Darby & Cushman

[57] ABSTRACT

A method for forming an ultrafine particle film of compound includes the steps of evacuating a vessel provided with an evaporation source in its bottom portion, by which a material to be evaporated is retained, and a base plate in its upper portion, on which ultrafine particles of compound are to be deposited, supplying a reactive gas into the evacuated vessel, evaporating the retained material by heating the evaporation source and making the material interact with the reactive gas to form ultrafine particles of compound and depositing the formed ultrafine particles of compound on the base plate. The reactive gas is directly supplied to an interaction area adjacent to the evaporation source, in which the evaporated material concentrically exists. And a device for forming a ultrafine particle film of compound has a vessel for forming a reactive gas atmosphere, an evaporation source for retaining and heating a material to be evaporated, which is provided in the bottom portion within the vessel, a base plate on which ultrafine particles of compound are to be deposited and which is provided in the upper portion within the vessel so as to be opposed to the evaporation source in the vertical direction, and a gas introducing pipe for supplying a reactive gas into the vessel, which has a gas injection port positioned in an interaction area adjacent to the evaporation source.

3 Claims, 9 Drawing Figures

METHOD AND DEVICE FOR FORMING ULTRAFINE PARTICLE FILM OF COMPOUND

BACKGROUND OF THE INVENTION

1. Field of the Invention

The present invention relates to a method and a device for forming an ultrafine particle film of compound by evaporating a material within a reactive gas of low pressure and making the evaporated material and the reactive gas interact with each other.

2. Description of the Prior Art

Ultrafine particles of compound can be formed by heating a material within a vacuum vessel to evaporate the material, and introducing a reactive gas into the vacuum vessel to make the evaporated material and the reactive gas interact with each other.

For example, conventionally, a film of ultrafine particles has been formed by evaporating tin(Sn), making the evaporated tin and oxygen ($O_2$) interact with each other to obtain ultrafine particles of tin dioxide($SnO_2$) and making the obtained ultrafine particles of tin dioxide deposit on the surface of a base plate provided in the vacuum vessel. This film is used as a gas sensing element of a gas sensor.

However, the above described method has a problem that the evaporated material and the reactive gas does not completely react to each other and incompletely reacted ultrafine particles are obtained as by-products.

For example, when ultrafine particles of $SnO_2$ is formed, ultrafine particles of tin monoxide(SnO) are obtained as by-products due to the incomplete reaction of Sn and $O_2$.

For obtaining the ultrafine particles of $SnO_2$ without containing SnO, a method of heating ultrafine particles of a mixture of formed $SnO_2$ and SnO in an atmosphere containing oxygen to transform SnO to $SnO_2$ has been proposed. However, this method has such a problem that the producing steps are increased and that the ultrafine particles grow to a large size due to the above heat treatment. Furthermore, this method has another problem that the quality of the base plate is lowered because of the heat treatment. In addition, when this method is used in forming a gas sensor wherein a film of ultrafine particles is formed on a base plate provided with circuits, the reliability of the obtained gas sensor is in danger of being lowered due to the heat treatment.

Another method of making Sn and $O_2$ excited in a high-frequency electric field interact with each other has been also proposed for improving the reactivity of Sn and $O_2$.

However, when Sn is evaporated in an atmosphere of $O_2$ of 1 Torr according to this method, the maximum content of $SnO_2$ in the formed ultrafine particles is 70% or less.

SUMMARY OF THE INVENTION

One object of the present invention is to provide a method and a device for forming an ultrafine particle film of compound without containing by-products by a small number of producing steps.

When an evaporation material is evaporated in a gas within a vacuum vessel, the area where the evaporated material concentrically exists is determined by the kinds of the material, the heating temperature, the gas pressure or the like. However, generally, the evaporated material concentrically exists in the area of not more than about 20 mm and sideward from an evaporation source on which the evaporation material is disposed. The interaction of the evaporation material and the gas takes place in this area.

According to the present invention, the above described object can be achieved by forcibly supplying gas into the above described interaction area and forming a flow of gas directed to the outside of this interaction area. In this case, it is preferable to supply gas to the central portion of the interaction area by positioning a gas injection port of a gas introducing pipe in or near the central portion of the above described interaction area.

When the number of molecules of gas becomes locally insufficient to the number of atoms of the evaporated material, the reactivity of the evaporated material and gas is lowered.

The present inventors have found that when Sn disposed on a boat as the evaporation source is heated within a vacuum vessel, the obtained evaporated Sn is made to interact with $O_2$ gas and the formed ultrafine particles of compound is made to deposit on a base plate disposed right above the boat, the $SnO_2$ content becomes minimum in the central portion of the base plate and is gradually increased toward the outside of the base plate as shown in FIG. 8.

And they have confirmed that the above phenomenon occurs by the following reason. Namely, as shown in FIG. 9, when the boat is heated and Sn material starts to be evaporated, $O_2$ existing in the interaction area wherein Sn atoms collide against and react to $O_2$ molecules is consumed. After $O_2$ is consumed, the evaporated Sn fills the interaction area to obstruct $O_2$ in an atmosphere from entering the interaction area. This results in $O_2$ surrounding the interaction area rising as convection currents.

Part of the $O_2$ enters the interaction area but is consumed before reaching the central portion of the interaction area.

This results in $O_2$ becoming insufficient in the central portion of the interaction area and the reaction of $Sn + \frac{1}{2}O_2 \rightarrow SnO$ easily taking place therein.

The present invention is made based on the above described observation. According to the present invention, gas is forcibly supplied to the interaction area wherein gas is insufficient, and preferably to the central portion of the interaction area to form a gas flow directed from the center of the interaction area to the outside thereof. This results in the evaporated material being completely made to interact with gas and only the ultrafine particles of compound without containing by-products being formed.

DETAILED DESCRIPTION OF THE EMBODIMENTS

Figure 1:
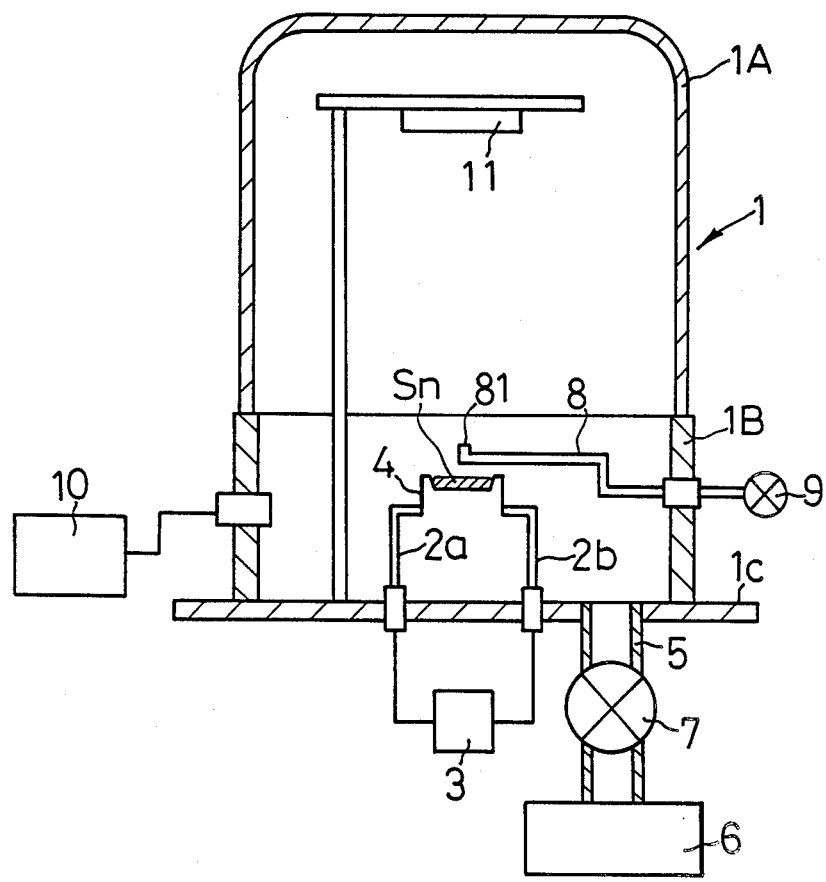
FIG. 1 is a view of one embodiment of a device according to the present invention.

As shown in FIG. 1, a vacuum vessel 1 is composed of a bell jar 1A, a feed through collar 1B and a base plate 1C. Within the vacuum vessel 1 are provided electrodes 2a and 2b, each being made of copper. The electrodes 2a and 2b are disposed on the base plate 1C through insulating members, respectively, and electrically connected to a power source 3 outside the vacuum vessel 1.

The electrodes 2a and 2b support a boat 4 as an evaporation source made of tungsten at top ends thereof.

The boat 4 retains an evaporation material Sn.

A vacuum pipe 5 which is communicated with a vacuum pump 6 opens in the base plate 1C. In the vacuum pipe 5 is installed a vacuum valve 7. By opening or closing the vacuum valve 7, the degree of vacuum of the interior of the vessel 1 can be kept to about $10^{-6}$ Torr.

A gas introducing pipe 8 is airtightly inserted into the feed through collar 1B, and a gas introducing value 9 is installed in the gas introducing pipe 8 outside the vessel 1 for voluntarily changing the flowing amount of introducing gas.

A gas injection port 81 of the gas introducing pipe 8 is positioned directly above the center of the boat 4 through a distance of about 20 mm and opens upward.

A vacuum meter 10 is provided in the feed through collar 1B for monitoring the pressure within the vessel 1.

Within the vessel 1 is supported a cooled base plate 11 above the boat 4.

In operation, the vacuum pump 6 is set on the vacuum valve 7 is opened so as to evacuate the interior of the vacuum vessel 1 to the degree of vacuum of about $10^{-6}$ Torr. Thereafter, the vacuum valve 7 is closed. Then, the gas introducing valve 9 is opened to introduce $O_2$ until the pressure within the vacuum vessel 1 becomes a predetermined value such as 1 Torr. Next, the power source 3 is set on to supply electric current to the boat 4.

When the boat 4 is heated and Sn starts evaporating, $O_2$ is consumed and the pressure within the vessel 1 is decreased.

By adjusting the opening degree of the valve 9 while monitoring the pressure within the vessel 1 by the vacuum meter, the flowing amount of $O_2$ is controlled so as to keep the pressure to 1 Torr.

$O_2$ of which the flowing amount is controlled as described above is directly supplied right above the material Sn from the injection port 81 of the gas introducing pipe 8.

In the interaction area, the evaporated Sn interacts with $O_2$ supplied in the vicinity of the center thereof to form ultrafine particles of $SnO_2$. And the obtained ultrafine particles of $SnO_2$ rise with the convection current of $O_2$ gas and deposit on the base plate 11.

Figure 7:
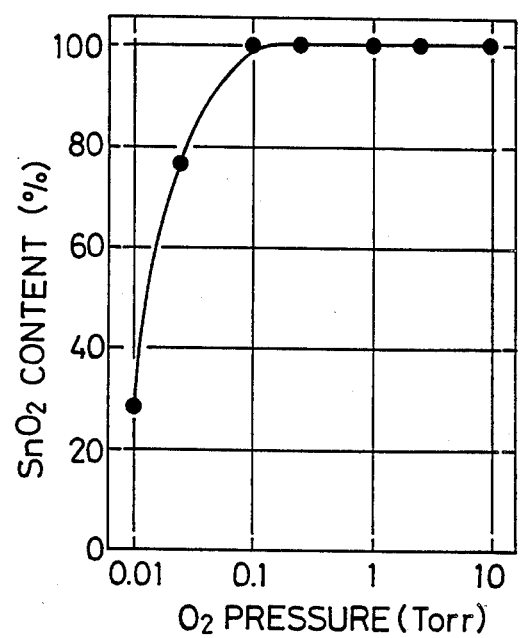
FIG. 7 is a graph showing the experimental result on the effect of the present invention.
Figure 8:
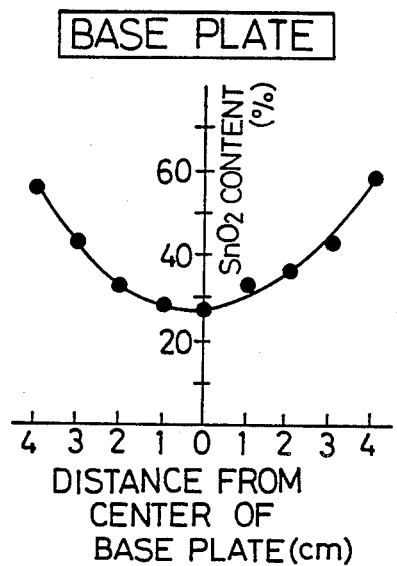
FIG. 8 is a graph showing the distribution of the content of $SnO_2$ in ultrafine particles obtained by the conventional device.
Figure 9:
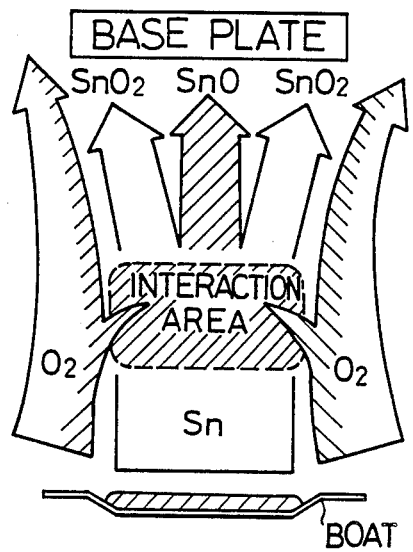
FIG. 9 is a diagram showing the forming process of ultrafine particles in the conventional device as a model.

FIG. 7 shows the $SnO_2$ content in the ultrafine particles obtained by the device of the present invention. As is apparent from FIG. 7, when the pressure $O_2$ is larger than 0.1 Torr, ultrafine particles composed of only $SnO_2$ ultrafine particles without containing SnO as by-products, can be obtained.

The gas injection port 81 of the gas introducing pipe 8 can have various structures other than that of the above embodiment.

Figure 2:
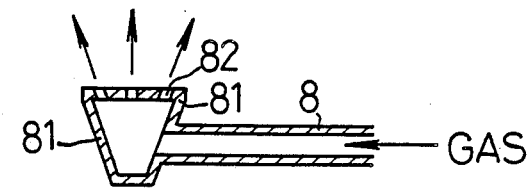
FIGS. 2, 3, 4, 5 and 6 are views, each illustrating the structure of a gas injection port of a gas introducing pipe used in the device according to the present invention, respectively.
Figure 2:
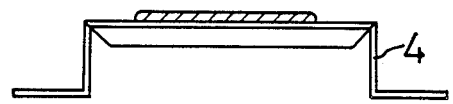

For example, when the material is widely disposed on the whole boat 4 so as to form a large interaction area, it is effective to use a nozzle like injection port 81 provided with a large number of small holes 82 as shown in FIG. 2 for uniformly injecting gas over a wide range.

Figure 3:
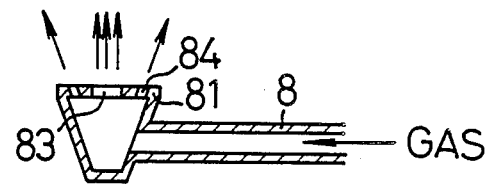
Figure 3:
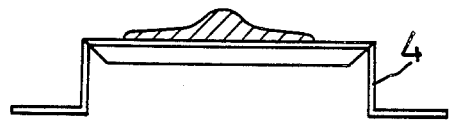

When the evaporation of Sn is not uniform, like the case that the material has a locally projecting shape and a large amount of the material is evaporated from the projection portion of the material, it is effective to provide small holes 83 and 84 of different diameters so that the hole 83 of a large diameter is opposed to the projecting portion of the material as shown in FIG. 3.

Figure 4:
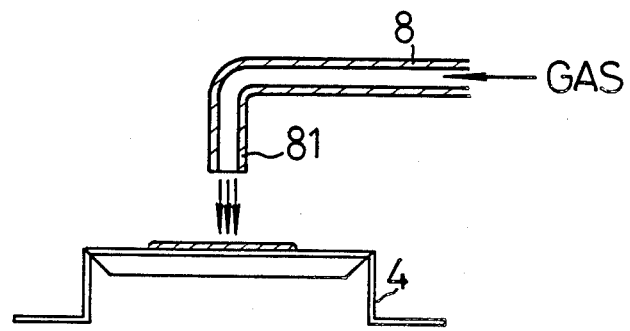

And when the interaction area is extremely adjacent to the boat 4, it is preferable to direct the injection port 81 of the pipe 8 toward the boat 4 as shown in FIG. 4.

Figure 5:
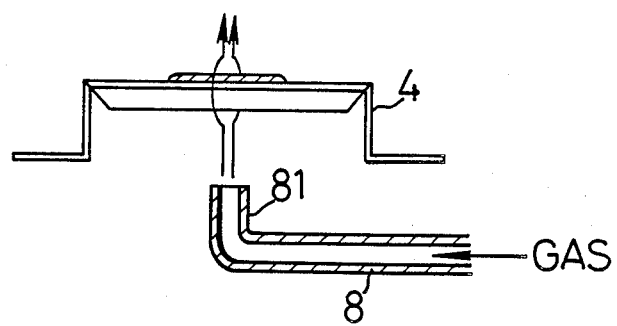

In addition, the injection port 81 of the pipe 8 may be disposed below the boat 4 as shown in FIG. 5.

Figure 6:
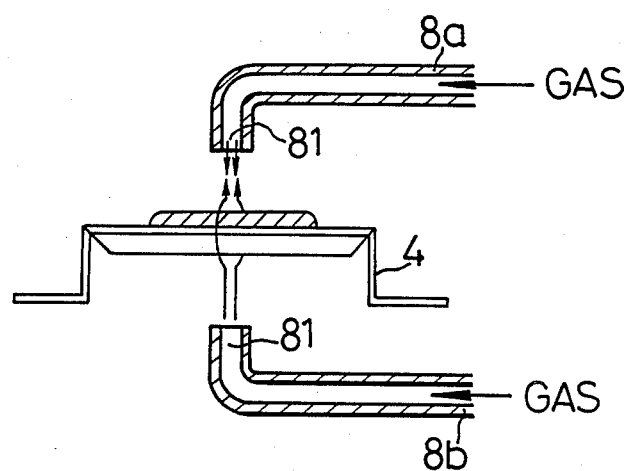

Furthermore, a plurality of gas introducing pipes may be provided as shown in FIG. 6 wherein gas is injected by a pipe 8a from the upper side of the boat 4 and by a pipe 8b from the lower side of the boat 4.

The material to be evapoated is not limited to Sn. Other evaporable material can be used. And gas is not limited to $O_2$ gas. When ultrafine particles of nitride is formed, $NH_3$ gas can be used and when ultrafine particles of carbide is formed, $CH_4$ gas can be used.

The casing for the evaporable material is not limited to the boat. A crucible may be used.

In addition, high-frequency induction heating means may be used as the heating means.

According to the present invention, the number of the producing steps and the cost of production are not increased as compared with the conventional method, and ultrafine particles of compound without containing by-products can be obtained.

What is claimed is:

1. A device for forming an ultrafine particle film of compound, comprising:
   a vessel for forming a reactive gas atmosphere;
   an evaporation source for retaining and heating a material to be evaporated;
   a base plate on which ultrafine particles of compound are to be deposited;
   said evaporation source being provided in the base portion within said vessel;
   said base plate being provided in the upper portion within said vessel;
   said evaporation source and said base plate being disposed so as to be opposed to each other in the vertical direction; and
   a gas introducing pipe for supplying a reactive gas into said vessel; said gas introducing pipe having a gas injection port which is positioned in an interaction area adjacent to said evaporation source, in which evaporation of said material concentrically exists,
   wherein said gas injection port is positioned at a center of said interaction area,
   wherein said gas injection port is formed into a nozzle provided with a plurality of small holes through which said reactive gas injects,
   wherein said gas injection port is positioned above said evaporation source so as to face said evaporation source.

2. A device for forming an ultrafine particle film of compound, comprising:
   a vessel for forming a reactive gas atmosphere;

an evaporation source for retaining and heating a material to be evaporated;

a base plae on which ultrafine particles of compound are to be deposited;

said evaporation source being provided in the base portion within said vessel;

said base plate being provided in the upper portion within said vessel;

said evaporation source and said base plate being disposed so as to be opposed to each other in the vertical direction; and a gas introducing pipe for supplying a reactive gas into said vessel; said gas introducing pipe having a gas injection port which is positioned in an interaction area adjacent to said evaporation source, in which evaporation of said material concentrically exists, wherein said gas injection port is positioned at a center of said interaction area, wherein said gas injection port is formed into a nozzle provided with a plurality of small holes through which said reactive gas injects, wherein said gas injection port is positioned below said evaporation source so as to face said evaporation source.

3. A device for forming an ultrafine particle film of compound, comprising:

a vessel for forming a reactive gas atmosphere;

an evaporation source for retaining and heating a material to be evaporated;

a base plate on which ultrafine particles of compound are to be deposited;

said evaporation source being provided in the base portion within said vessel;

said base plate being provided in the upper portion within said vessel;

said evaporation source and said base plate being disposed so as to be opposed to each other in the vertical direction; and a gas introducing pipe for supplying a reactive gas into said vessel; said gas introducing pipe having a gas injection port which is positioned in an interaction area adjacent to said evaporation source, in which evaporation of said material concentrically exists, wherein said gas injection port is positioned at a center of said interaction area, wherein said gas injection port is formed into a nozzle provided with a plurality of small holes through which said reactive gas injects, wherein said gas introducing pipe is composed of two gas introducing pipes, said gas injecting port of one of said two gas introducing pipes is disposed above said evaporation source so as to face said evaporation source and said gas injecting port of the other one of said two gas introducing pipes is disposed below said evaporation source so as to face said evaporation source.

* * * * *